(12) United States Patent
Chang

(10) Patent No.: US 12,237,244 B2
(45) Date of Patent: Feb. 25, 2025

(54) HIGH DENSITY THROUGH SILICON CONDUCTIVE STRUCTURES

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 350 days.

(21) Appl. No.: 17/666,469

(22) Filed: Feb. 7, 2022

(65) Prior Publication Data
US 2022/0415757 A1 Dec. 29, 2022

Related U.S. Application Data

(60) Provisional application No. 63/215,340, filed on Jun. 25, 2021.

(51) Int. Cl.
*H01L 21/00* (2006.01)
*H01L 23/48* (2006.01)
*H01L 25/065* (2023.01)
*H01L 23/00* (2006.01)

(52) U.S. Cl.
CPC ........ *H01L 23/481* (2013.01); *H01L 25/0657* (2013.01); *H01L 24/32* (2013.01); *H01L 2224/32145* (2013.01); *H01L 2225/06544* (2013.01)

(58) Field of Classification Search
CPC .... H01L 23/481; H01L 25/0657; H01L 24/32
See application file for complete search history.

(56) References Cited

U.S. PATENT DOCUMENTS

| | | | |
|---|---|---|---|
| 8,890,293 B2 * | 11/2014 | Lu ................... | H01L 21/823481 257/490 |
| 11,094,650 B1 * | 8/2021 | Liu ...................... | H01L 23/5225 |
| 11,545,443 B2 * | 1/2023 | Wu ....................... | H01L 23/562 |

(Continued)

FOREIGN PATENT DOCUMENTS

| | | | | |
|---|---|---|---|---|
| CN | 113257781 A | * | 8/2021 | ........... H01L 21/768 |
| TW | 202131471 A | * | 8/2021 | ........... H01L 21/768 |

*Primary Examiner* — Laura M Menz
(74) *Attorney, Agent, or Firm* — Kilpatrick Townsend & Stockton LLP

(57) ABSTRACT

A semiconductor device is disclosed. The semiconductor device includes a first substrate. The first substrate includes a first dielectric layer, and a vertical conductive area, where the vertical conductive area includes one or more vertical conductive structures extending through the first dielectric layer, where each line segment of a non-square quadrilateral contacts at least one of the one or more vertical conductive structures. The vertical conductive area also includes a continuous conductive guard ring structure in the first dielectric layer, where the continuous conductive guard ring structure surrounds the one or more vertical conductive structures. The semiconductor device also includes a second substrate, including a first conductor, and a second conductor, where the first conductor of the second substrate is electrically connected to at least one of the vertical conductive structures of the first substrate.

20 Claims, 13 Drawing Sheets

(56) References Cited

U.S. PATENT DOCUMENTS

| | | | |
|---|---|---|---|
| 11,670,604 B2* | 6/2023 | Liu | H01L 23/585 |
| | | | 257/774 |
| 11,942,368 B2* | 3/2024 | Kao | H01L 21/76898 |
| 2013/0154048 A1* | 6/2013 | Lu | H01L 23/481 |
| | | | 438/667 |
| 2019/0021176 A1* | 1/2019 | Law | H05K 3/4038 |
| 2021/0005558 A1* | 1/2021 | Wu | B81C 1/00238 |
| 2021/0249365 A1* | 8/2021 | Liu | H01L 21/76802 |
| 2021/0375796 A1* | 12/2021 | Liu | H01L 23/5283 |
| 2022/0301981 A1* | 9/2022 | Chang | H01L 24/19 |
| 2022/0344284 A1* | 10/2022 | Chang | H01L 21/76816 |
| 2022/0415757 A1* | 12/2022 | Chang | H01L 25/0657 |
| 2023/0062027 A1* | 3/2023 | Chang | H01L 23/481 |
| 2023/0140683 A1* | 3/2023 | Chang | H01L 21/76898 |
| | | | 257/774 |
| 2023/0137490 A1* | 5/2023 | Chang | H01L 24/80 |
| | | | 438/455 |
| 2023/0260933 A1* | 8/2023 | Liu | H01L 21/76802 |
| | | | 257/774 |
| 2023/0307384 A1* | 9/2023 | Chang | H01L 25/105 |
| 2023/0343653 A1* | 10/2023 | Chang | H01L 22/14 |
| 2024/0030082 A1* | 1/2024 | Chang | H01L 23/3192 |
| 2024/0047282 A1* | 2/2024 | Chang | H01L 23/10 |
| 2024/0047383 A1* | 2/2024 | Chang | H01L 23/585 |
| 2024/0063185 A1* | 2/2024 | Chang | H01L 23/481 |
| 2024/0063272 A1* | 2/2024 | Chang | H01L 23/585 |

* cited by examiner

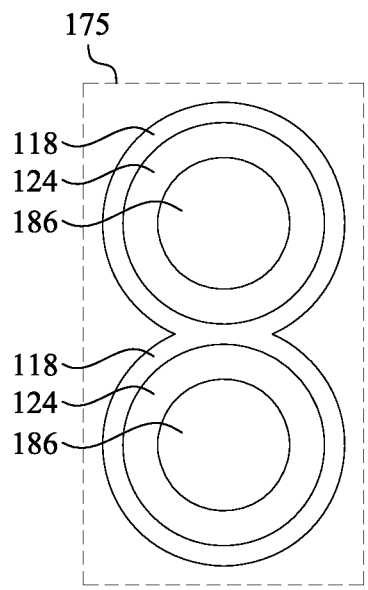 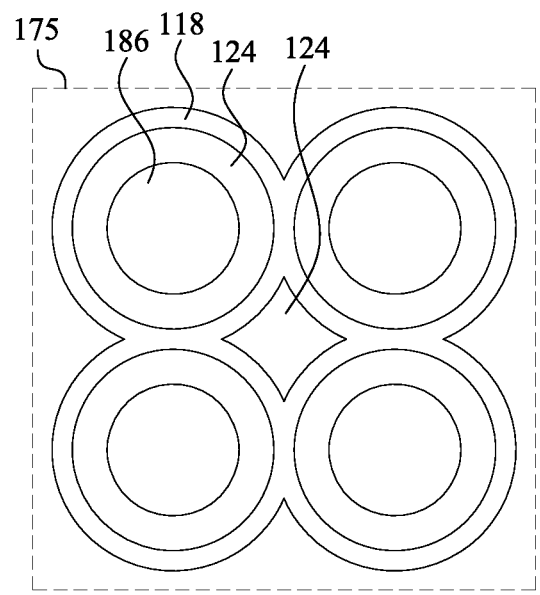
Fig. 9A          Fig. 9B
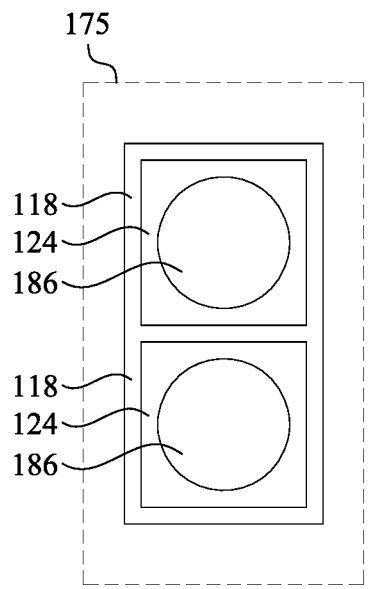 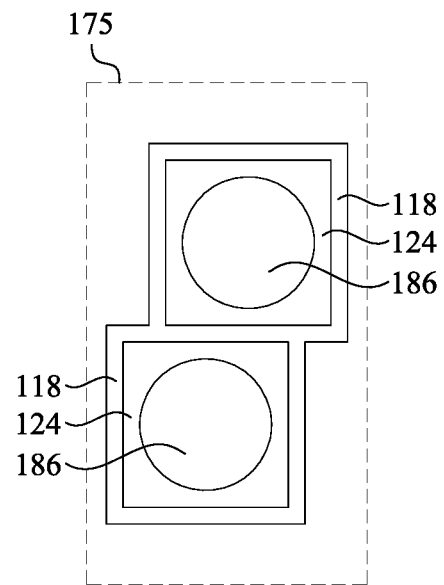
Fig. 9C          Fig. 9D

HIGH DENSITY THROUGH SILICON CONDUCTIVE STRUCTURES

PRIORITY CLAIM AND CROSS-REFERENCE

The present application claims priority to U.S. Provisional Patent Application No. 63/215,340, filed on Jun. 25, 2021, and entitled "SoIC High Density Grouping TSV Guard Ring Design," the entire disclosure of which is incorporated herein by reference.

TECHNICAL FIELD

The subject matter described herein relates to conductive structures which extend through multiple layers of a semiconductor device, and more particularly to these conductive structures which are surrounded by a guard ring.

BACKGROUND

Semiconductor manufacturing processes include numerous fabrication steps or processes, each of which contributes to the formation of one or more semiconductor layers. Some layers are conductive and provide electrical connections between devices of an electronic system. Some layers may be formed, for example, by doping sections of a crystalline semiconductor substrate. In addition, one or more layers may be formed by adding, for example, conductive, resistive, and/or insulative layers on the crystalline semiconductor substrate.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-13C illustrate top-down views of vertical conductor areas, in accordance with some embodiments.

When practical, similar reference numbers denote similar structures, features, or elements.

DETAILED DESCRIPTION

Figure 1:
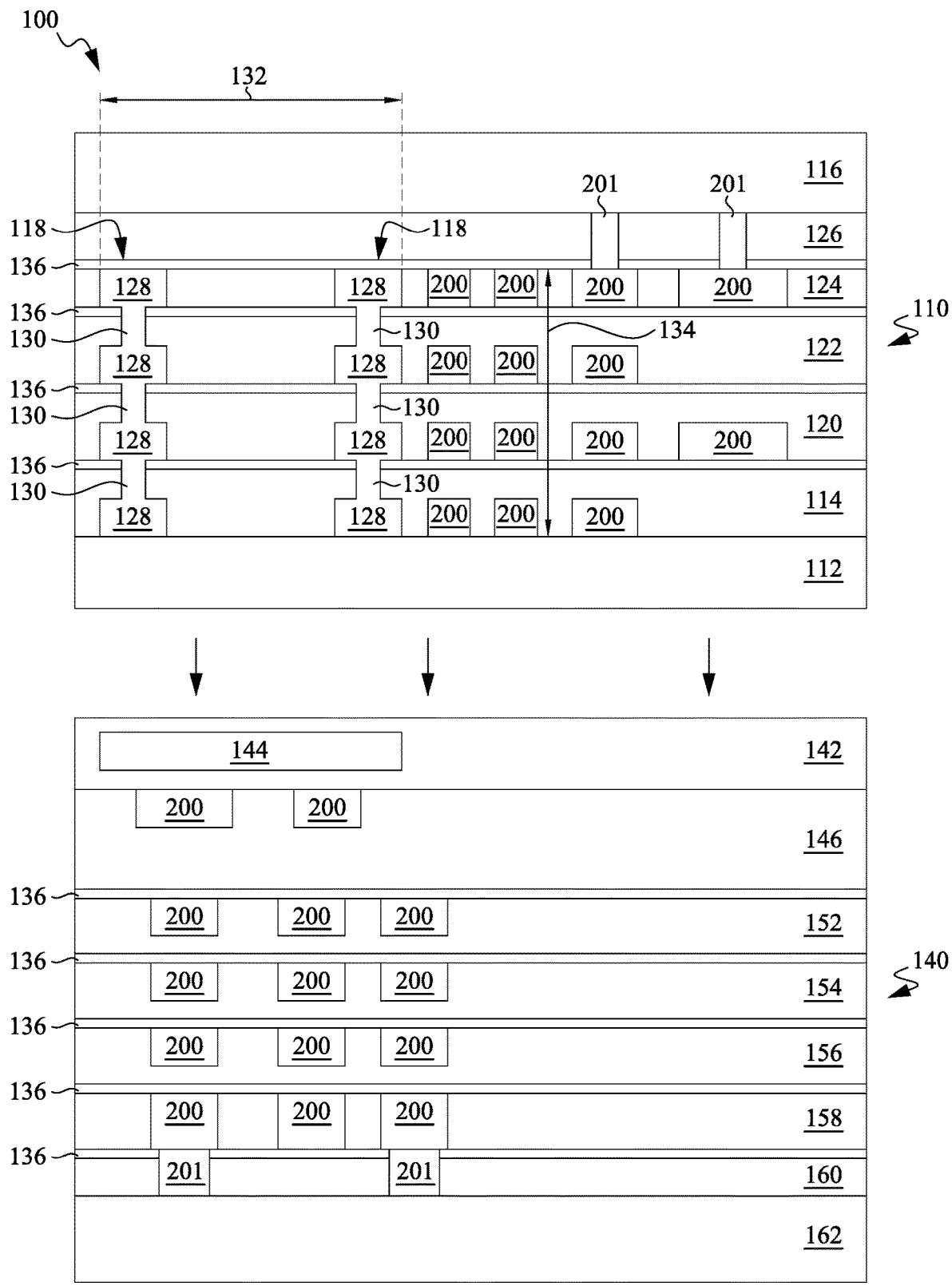
FIGS. 1-7 illustrate cross sectional views of a semiconductor arrangement at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Some embodiments relate to a semiconductor arrangement. In accordance with some embodiments, the semiconductor arrangement includes a first portion including a first passivation layer, a first dielectric layer over the first passivation layer, a first substrate over the first dielectric layer, a first conductive layer over the first substrate, and a first guard ring in the first dielectric layer. The semiconductor arrangement includes a second portion under the first portion. The second portion includes a second passivation layer and a second conductive layer in the second passivation layer. The semiconductor arrangement includes a vertical conductive structure passing through the first substrate, the first dielectric layer, and the first passivation layer. In some embodiments, the vertical conductive structure contacts the first conductive layer and the second conductive layer and is surrounded by the guard ring.

Because of minimum spacing and width requirements for various layers, vertical conductive structures and their associated guard rings conventionally require significant area. Embodiments discussed herein provide improved area density for vertical conductive structures and their associated guard rings.

According to some embodiments, the first dielectric layer is an extra low-k (ELK) dielectric having a dielectric constant of about 2.6 or less. According to some embodiments, the guard ring protects, shields, electrically isolates, etc. at least one of the vertical conductive structure or the first dielectric layer. In some embodiments, the guard ring provides support, reinforcement, structural integrity, etc. for at least one of the vertical conductive structure or the first dielectric layer.

Referring to FIG. 1, a semiconductor device 100 includes a first portion 110 and a second portion 140, according to some embodiments. In some embodiments, the first portion 110 and the second portion 140 are fabricated separately and then placed together. In some embodiments, the first portion 110 is fabricated, inverted to the orientation illustrated in FIG. 1, and then placed on top of the second portion 140.

In some embodiments, the first portion 110 includes a first passivation layer 112, a first dielectric layer 114 over the first passivation layer 112, a second dielectric layer 120 over the first dielectric layer 114, a third dielectric layer 122 over the second dielectric layer 120, a fourth dielectric layer 124 over the third dielectric layer 122, a first interlayer dielectric (ILD) layer 126 over the fourth dielectric layer 124, and a first substrate 116 over the first ILD layer 126. A guard ring 118 is in the first dielectric layer 114, the second dielectric layer 120, the third dielectric layer 122, and the fourth dielectric layer 124, according to some embodiments. In some embodiments, the first portion 110 includes more than four dielectric layers. In some embodiments, the first portion 110 includes fewer than four dielectric layers. In some embodiments, the guard ring 118 is in all of the dielectric layers. In some embodiments, the guard ring 118 is in fewer than all of the dielectric layers.

In some embodiments, the first passivation layer 112 includes at least one of AlN, Al2O3, SiO2, or Si3N4, or other suitable materials. In some embodiments, the first passivation layer 112 includes a chemically inert, corrosion-resistant dielectric material. In some embodiments, the first passivation layer 112 includes an organic compound having at least one of an N-, P- or S-group molecular structure. In some embodiments, the first passivation layer 112 has a dielectric constant of about 4.2.

In some embodiments, the first passivation layer 112 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, a passivation process, or other suitable techniques. In some embodiments, a chemically-stable material is used to produce the first passivation layer 112. In some embodiments, the passivation process is a process in which a film covers an underlying material, such as the first dielectric layer 114 prior to the first portion 110 being inverted to the orientation illustrated in FIG. 1. In some embodiments, the film inhibits dissolution of the underlying material. In some embodiments, the film reduces chemical reactivity with regard to the underlying material. In some embodiments, the film reduces electrical reactivity with regard to the underlying material. In some embodiments, the passivation process includes at least one of oxidation of a surface of the underlying material or complexing of the surface with an organic compound. In some embodiments, the first passivation layer 112 inhibits diffusion of at least one of charges, atoms, or ions into the underlying material. In some embodiments, the first passivation layer 112 mitigates oxidation of the underlying material. In some embodiments, the first passivation layer 112 protects the underlying material from environmental conditions. In some embodiments, the first passivation layer 112 acts as a diffusion barrier with regard to the underlying material.

In some embodiments, at least one of the dielectric layers 114, 120, 122, or 124 includes at least one of a polymer, an oxide, polybenzobisoxazole (PBO), a polyimide (PI), a metal nitride, silicon, germanium, carbide, gallium, arsenide, germanium, arsenic, indium, silicon oxide, sapphire, or other suitable materials. In some embodiments, at least one of the dielectric layers 114, 120, 122, or 124 electrically insulates inter connect lines in the first portion 110. In some embodiments, at least one of the dielectric layers 114, 120, 122, or 124 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques. In some embodiments, at least some of the dielectric layers are formed in a same manner. In some embodiments, at least some of the dielectric layers are formed in different manners.

According to some embodiments, at least one of the dielectric layers 114, 120, 122, or 124 is an ELK dielectric having a dielectric constant of about 2.6 or less. In some embodiments, at least one of the dielectric layers 114, 120, 122, or 124 has a dielectric constant less than a dielectric constant of the first passivation layer 112.

In some embodiments, the first ILD layer 126 includes at least one of tetraethylorthosilicate (TEOS), borophosphosilicate glass (BPSG), fused silica glass (FSG), phosphosilicate glass (PSG), boron doped silicon glass (BSG), polymeric thermoset material, or other suitable materials. In some embodiments, the first ILD layer 126 reduces capacitive coupling between adjacent conductive lines. In some embodiments, the first ILD layer 126 has a dielectric constant of about 4.2. In some embodiments, the first ILD layer 126 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

In some embodiments, the first substrate 116 includes at least one of an epitaxial layer, a silicon-on-insulator (SOI) structure, a wafer, or a die formed from a wafer. In some embodiments, the first substrate 116 includes silicon or other suitable materials.

According to some embodiments, the guard ring 118 includes at least one of a metal layer 128 or a vertical interconnect access (VIA) 130. According to some embodiments, at least one of the metal layer 128 or the VIA 130 includes at least one of Al, Cu, Sn, Ni, Au, Ag, W, or other suitable material. In some embodiments, at least one of the metal layer 128 or the VIA 130 does not include metal. In some embodiments, at least one of the metal layer 128 or the VIA 130 is in at least one of the dielectric layers 114, 120, 122, or 124. According to some embodiments, the guard ring 118 includes alternating layers of the metal layer 128 and the VIA 130. According to some embodiments, at least some of the metal layers 128 have a same width. In some embodiments, at least some of the metal layers 128 have different widths. In some embodiments, at least some of the metal layers 128 have a same height. In some embodiments, at least some of the metal layers 128 have different heights. In some embodiments, at least some of the metal layers 128 have different compositions as compared to other metal layers 128. In some embodiments, at least some of the VIAs 130 have a same width. In some embodiments, at least some of the VIAs 130 have different widths. In some embodiments, at least some of the VIAs 130 have a same height. In some embodiments, at least some of the VIAs 130 have different heights. In some embodiments, at least some of the VIAs 130 have different compositions as compared to other VIAs 130.

According to some embodiments, a width of at least some metal layers 128 is different than a width of at least some VIAs 130. In some embodiments, a width of at least some metal layers 128 is the same as a width of at least some VIAs 130. In some embodiments, a height of at least some metal layers 128 is different than a height of at least some VIAs 130. In some embodiments, a height of at least some metal layers 128 is the same as a height of at least some VIAs 130. In some embodiments, the guard ring 118 has a width 132 of about 3 micrometers to about 6 micrometers. In some embodiments, the guard ring 118 has a depth 134 of about 0.5 micrometer to about 4 micrometers.

In some embodiments, at least one of the metal layer 128 or the VIA 130 is formed by at least one of lithography, etching, physical vapor deposition (PVD), sputtering, chemical vapor deposition (CVD), low pressure CVD (LPCVD), atomic layer chemical vapor deposition (AL-CVD), ultrahigh vacuum CVD (UHVCVD), reduced pressure CVD (RPCVD), molecular beam epitaxy (MBE), liquid phase epitaxy (LPE), or other suitable techniques. In the lithography, a light sensitive material, such as a photoresist is formed over a layer to be patterned. Properties, such as solubility, of the photoresist are affected by the light. The photoresist is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In the positive photoresist, illuminated regions of the positive photoresist become soluble and are removed via application of the solvent during development. Thus, a pattern formed in the positive photoresist is a positive image of opaque regions of the template between the light source and the positive photoresist. According to some embodiments, an etchant has a selectivity such that the etchant removes or etches away the layer under the photoresist at a greater rate than the etchant removes or etches away the photoresist. Accordingly, an opening in the photoresist allows the etchant to form a corresponding opening in the layer under the photoresist, and thereby transfer a pattern in the photoresist to the layer under the photoresist. The pattern in the layer under the photoresist is filled with one or more materials to form one or more elements, features, etc. and the patterned photoresist is stripped or washed away at least one of before or after the pattern in the layer under the photoresist is filled with the one or more materials. In some embodiments, a dual damascene process is used to form at least one of a metal layer 128 or a VIA 130.

In some embodiments, a metal layer 128 and a VIA 130 are formed in the first dielectric layer 114, then the second dielectric layer 120 is formed and a metal layer 128 and a VIA 130 are formed in the second dielectric layer 120, then the third dielectric layer 122 is formed and a metal layer 128 and a VIA 130 are formed in the third dielectric layer 122, then the fourth dielectric layer 124 is formed and a metal layer 128 and a VIA 130 are formed in the fourth dielectric layer 124. In some embodiments, such a process is repeated any number of times to form the guard ring 118. In some embodiments, the one or more dielectric layers do not include at least one of a metal layer 128 or a VIA 130. In some embodiments, the guard ring 118 is discontinuous in that one or more intervening dielectric layers do not include at least one of a metal layer 128 or a VIA 130. In some embodiments, at least one of one or more of the metal layers 128 or one or more of the VIAs 130 are formed prior to at least some of a surrounding dielectric layer, such as at least one of at least some of the first dielectric layer 114, at least some of the second dielectric layer 120, at least some of the third dielectric layer 122, or at least some of the fourth dielectric layer 124. In some embodiments, at least some of a layer is formed and patterned to form at least one metal layer 128 and then at least some of the first dielectric layer 114 is formed around the at least one metal layer 128 such that the at least one metal layer 128 is in the first dielectric layer 114. In some embodiments, at least some of a layer is formed and patterned to form at least one VIA 130 and then at least some of the first dielectric layer 114 is formed around the at least one VIA 130 such that the at least one VIA 130 is in the first dielectric layer 114. In some embodiments, at least some of a layer is formed and patterned to form at least one metal layer 128 and then at least some of the second dielectric layer 120 is formed around the at least one metal layer 128 such that the at least one metal layer 128 is in the second dielectric layer 120. In some embodiments, at least some of a layer is formed and patterned to form at least one VIA 130 and then at least some of the second dielectric layer 120 is formed around the at least one VIA 130 such that the at least one VIA 130 is in the second dielectric layer 120. In some embodiments, at least some of a layer is formed and patterned to form at least one metal layer 128 and then at least some of the third dielectric layer 122 is formed around the at least one metal layer 128 such that the at least one metal layer 128 is in the third dielectric layer 122. In some embodiments, at least some of a layer is formed and patterned to form at least one VIA 130 and then at least some of the third dielectric layer 122 is formed around the at least one VIA 130 such that the at least one VIA 130 is in the third dielectric layer 122. In some embodiments, at least some of a layer is formed and patterned to form at least one metal layer 128 and then at least some of the fourth dielectric layer 124 is formed around the at least one metal layer 128 such that the at least one metal layer 128 is in the fourth dielectric layer 124.

In some embodiments, the first portion 110 includes at least one of one or more conductive elements 200 or one or more contacts 201. In some embodiments, at least some of the conductive elements 200 include at least one of Al, Cu, Sn, Ni, Au, Ag, W, or other suitable materials. In some embodiments, at least some of the conductive elements 200 have a same composition as at least one of at least some of the metal layers 128 or at least some of the VIAs 130. In some embodiments, at least some of the conductive elements 200 have a different composition than at least one of at least some of the metal layers 128 or at least some of the VIAs 130. In some embodiments, at least some of the conductive elements 200 have different compositions as compared to other conductive elements 200. In some embodiments, at least some of the contacts 201 include at least one of Al, Cu, Sn, Ni, Au, Ag, W, or other suitable materials. In some embodiments, at least some of the contacts 201 have a same composition as at least one of at least some of the metal layers 128, at least some of the VIAs 130, or at least some of the conductive elements 200. In some embodiments, at least some of the contacts 201 have a different composition than at least one of at least some of the metal layers 128, at least some of the VIAs 130, or at least some of the conductive elements 200. In some embodiments, at least some of the contacts 201 have different compositions as compared to other contacts 201. In some embodiments, at least one of the conductive element 200 or the contact 201 does not include metal. In some embodiments, at least some contacts 201 are in contact with at least some conductive elements 200. In some embodiments, a conductive element 200 serves as a routing line in the semiconductor device 100 and a contact 201 that is in touch with the conductive element provides an electrically conductive pathway to the routing line.

According to some embodiments, any of the conductive elements 200 have any desired shape or size. According to some embodiments, any of the contacts 201 have any desired shape or size. In some embodiments, at least one of the conductive element 200 or the contact 201 is formed by at least one of lithography, etching, physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. In some embodiments, a conductive element 200 is formed in the first dielectric layer 114, then the second dielectric layer 120 is formed and a conductive element 200 is formed in the second dielectric layer 120, then the third dielectric layer 122 is formed and a conductive element 200 is formed in the third dielectric layer 122, then the fourth dielectric layer 124 is formed and a conductive element 200 is formed in the fourth dielectric layer 124. In some embodiments, such a process is repeated any number of times. In some embodiments, at least one of the dielectric layers do not include a conductive element 200. In some embodiments, the first ILD layer 126 is formed and a contact 201 is formed, such as by etching and deposition, in the first ILD layer 126. In some embodiments, at least one of one or more of the conductive elements 200 or one or more of the contacts 201 are formed prior to at least some of a surrounding layer, such as at least one of at least some of the first dielectric layer 114, at least some of the second dielectric layer 120, at least some of the third dielectric layer 122, at least some of the fourth dielectric layer 124, or at least some of the first ILD layer 126. In some embodiments, at least some of a layer is formed and patterned to form at least one conductive element 200 and then at least some of the first dielectric layer 114 is formed around the at least one conductive element 200 such that the at least one conductive element 200 is in the first dielectric layer 114. In some embodiments, at least some of a layer is formed and patterned to form at least one conductive element 200 and then at least some of the second dielectric layer 120 is formed around the at least one conductive element 200 such that the at least one conductive element 200 is in the second dielectric layer 120. In some embodiments, at least some of a layer is formed and patterned to form at least one conductive element 200 and then at least some of the third dielectric layer 122 is formed around the at least one conductive element 200 such that the at least one conductive element 200 is in the third dielectric layer 122. In some embodiments, at least some of a layer is formed and patterned to form at least one conductive element 200 and then at least some of the fourth dielectric layer 124 is formed around the at least one conductive element 200 such that the at least one conductive element 200 is in the fourth dielectric layer 124. In some embodiments, at least some of a layer is formed and patterned to form at least one contact 201 and then at least some of the first ILD layer 126 is formed around the at least one contact 201 such that the at least one contact 201 is in the first ILD layer 126.

In some embodiments, the first portion 110 includes one or more etch stop layers 136, such as between adjacent dielectric layers. In some embodiments, an etch stop layer has a different etch selectivity relative to an overlying or adjacent layer such that when an etchant etches through the overlying layer the etching process slows or stops upon the etchant encountering the underlying etch stop layer. According to some embodiments, an etch stop layer comprises silicon, carbon, or other suitable materials. In some embodiments, at least some different etch stop layers have different compositions, such as due to the use of different etchants to etch different materials. In some embodiments, the etch stop layer 136 between the first ILD layer 126 and the fourth dielectric layer 124 has a different composition than at least one other etch stop layer 136, such as due to a different etchant used to etch the first ILD layer 126 as compared an etchant used to etch at least one of the fourth dielectric layer 124, the third dielectric layer 122, the second dielectric layer 120, or the first dielectric layer 114.

In some embodiments, the second portion 140 includes a second passivation layer 142, a conductive layer 144 in the second passivation layer 142, a transition metal dielectric (TMD) layer 146 under the second passivation layer 142, a first inter-metal dielectric (IMD) layer 152 under the TMD layer 146, a second IMD layer 154 under the first IMD layer 152, a third IMD layer 156 under the second IMD layer 154, a fourth IMD layer 158 under the third IMD layer 156, a second ILD layer 160 under the fourth IMD layer 158, and a second substrate 162 under the second ILD layer 160. In some embodiments, the second portion 140 includes more than four IMD layers. In some embodiments, the second portion 140 includes fewer than four IMD layers.

In some embodiments, the second passivation layer 142 includes at least one of AlN, Al2O3, SiO2, or Si3N4, or other suitable materials. In some embodiments, the second passivation layer 142 includes a chemically inert, corrosion-resistant dielectric material. In some embodiments, the second passivation layer 142 includes an organic compound having at least one of an N-, P- or S-group molecular structure. In some embodiments, the second passivation layer 142 includes heteroatoms. In some embodiments, the second passivation layer 142 has a dielectric constant of about 4.2. In some embodiments, the second passivation layer 142 has a same composition as the first passivation layer 112. In some embodiments, the second passivation layer 142 has a different composition than the first passivation layer 112. In some embodiments, the second passivation layer 142 is formed by at least one of a passivation process, physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques. In some embodiments, the second passivation layer 142 is formed in a same manner as the first passivation layer 112. In some embodiments, the second passivation layer 142 is formed in a different manner than the first passivation layer 112.

In some embodiments, the conductive layer 144 includes at least one of Al, Cu, Sn, Ni, Au, Ag, W, or other suitable materials. In some embodiments, the conductive layer 144 includes a binary alloy of aluminum and copper. In some embodiments, the conductive layer 144 is embedded in the second passivation layer 142 so as to be covered on all sides by the second passivation layer 142. In some embodiments, the conductive layer 144 is formed by at least one of lithography, etching, physical vapor deposition (PVD), sputtering, chemical vapor deposition (CVD), low pressure CVD (LPCVD), atomic layer chemical vapor deposition (AL-CVD), ultrahigh vacuum CVD (UHVCVD), reduced pressure CVD (RPCVD), molecular beam epitaxy (MBE), liquid phase epitaxy (LPE), or other suitable techniques.

In some embodiments, the TMD layer 146 includes at least one of Al, Cu, Sn, Ni, Au, Ag, W, or other suitable materials. In some embodiments, the TMD layer 146 includes an atomically thin layer of a transition metal and a chalcogen. In some embodiments, the transition metal includes at least one of Mo, W, or other suitable materials. In some embodiments, the chalcogen includes at least one of S, Si, Te, or other suitable materials. According to some embodiments, atoms of the transition metal are sandwiched between two layers of chalcogen atoms. In some embodiments, the TMD layer 146 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

According to some embodiments, at least one of the IMD layers 152, 154, 156, or 158 includes at least one of a polymer, an oxide, polybenzobisoxazole (PBO), a polyimide (PI), a metal nitride, silicon, germanium, carbide, gallium, arsenide, germanium, arsenic, indium, silicon oxide, sapphire, or other suitable materials. In some embodiments, at least one of the IMD layers 152, 154, 156, or 158 electrically insulate inter connect lines in the second portion 140. In some embodiments, at least one of the IMD layers 152, 154, 156, or 158 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques. In some embodiments, at least some of the IMD layers are formed in a same manner. In some embodiments, at least some of the IMD layers are formed in different manners.

According to some embodiments, at least one of the IMD layers 152, 154, 156, or 158 has a dielectric constant of about 3 or less. In some embodiments, at least one of the IMD layers 152, 154, 156, or 158 has a dielectric constant less than a dielectric constant of the second passivation layer 142.

In some embodiments, the second ILD layer 160 includes at least one of tetraethylorthosilicate (TEOS), borophosphosilicate glass (BPSG), fused silica glass (FSG), phosphosilicate glass (PSG), boron doped silicon glass (BSG), polymeric thermoset material, or other suitable materials. In some embodiments, the second ILD layer 160 reduces capacitive coupling between adjacent conductive lines. In some embodiments, the second ILD layer 160 has a dielectric constant of about 4.2. In some embodiments, the second ILD layer 160 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. In some embodiments, the second ILD layer 160 is formed in a same manner as the first ILD layer 126. In some embodiments, the second ILD layer 160 is formed in a different manner than the first ILD layer 126.

In some embodiments, the second substrate 162 includes at least one of an epitaxial layer, a silicon-on-insulator (SOI) structure, a wafer, or a die formed from a wafer. In some embodiments, the second substrate 162 includes silicon or other suitable materials. In some embodiments, the second substrate 162 has a same composition as the first substrate 116. In some embodiments, the second substrate 162 has a different composition than the first substrate 116. In some embodiments, the second portion 140 includes at least one of one or more conductive elements 200, one or more contacts 201, or one or more etch stop layers 136. In some embodiments, at least some of the conductive elements 200 in the second portion 140 at least one of have a same composition, are formed in a same manner, perform a same function, etc. as at least some of the conductive elements 200 in the first portion 110. In some embodiments, at least some of the contacts 201 in the second portion 140 at least one of have a same composition, are formed in a same manner, perform a same function, etc. as at least some of the contacts 201 in the first portion 110. In some embodiments, at least some of the etch stop layers 136 in the second portion 140 at least one of have a same composition, are formed in a same manner, perform a same function, etc. as at least some of the etch stop layers 136 in the first portion 110.

Figure 2:
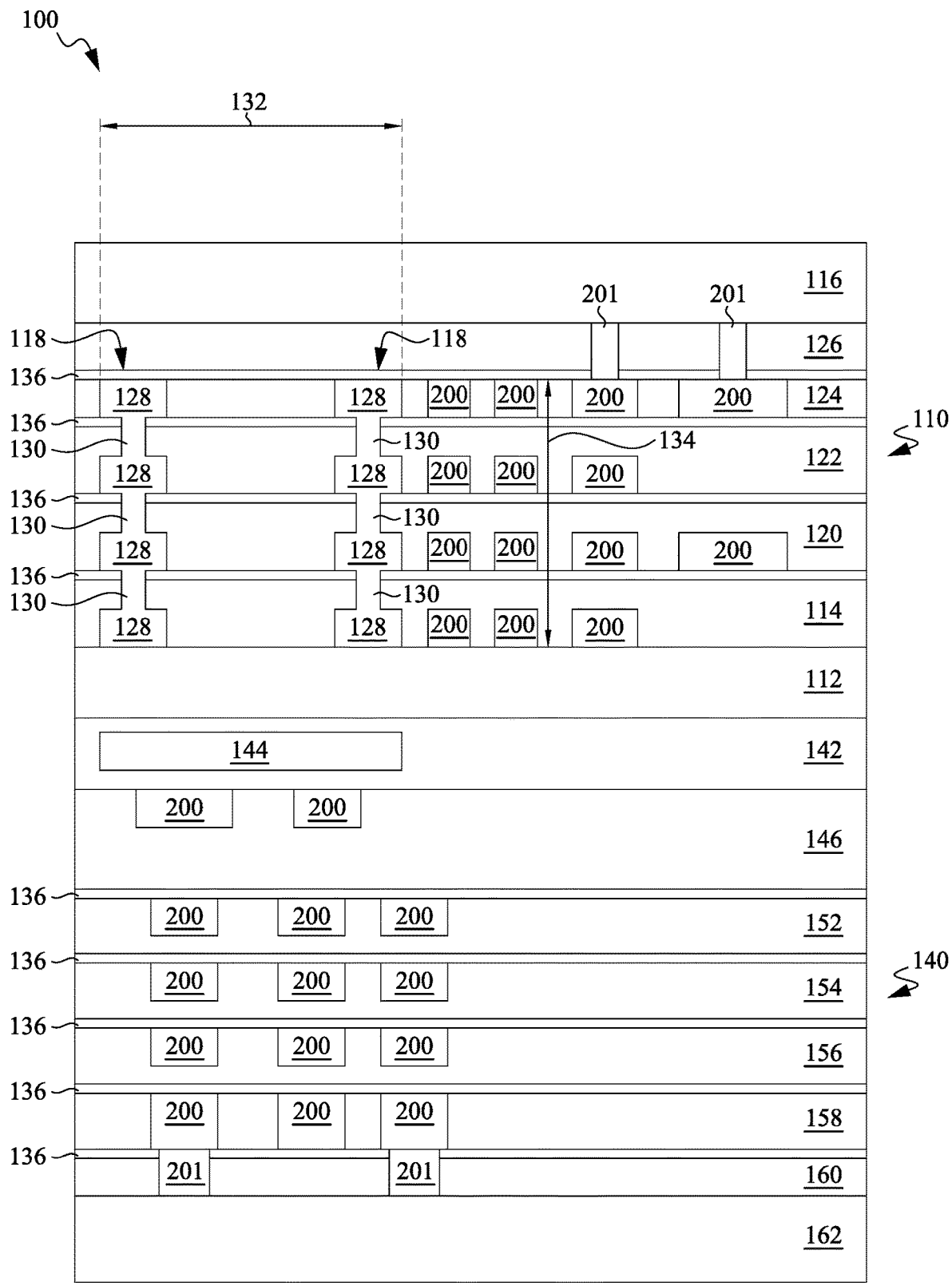

FIG. 2 illustrates the first portion 110 on the second portion 140, according to some embodiments. According to some embodiments, the first passivation layer 112 contacts the second passivation layer 142. According to some embodiments, the first passivation layer 112 is adhered to the second passivation layer 142. According to some embodiments, a delineation persists between the first passivation layer 112 and the second passivation layer 142 despite the first passivation layer 112 being at least one of in contact with or adhered to the second passivation layer 142.

Figure 3:
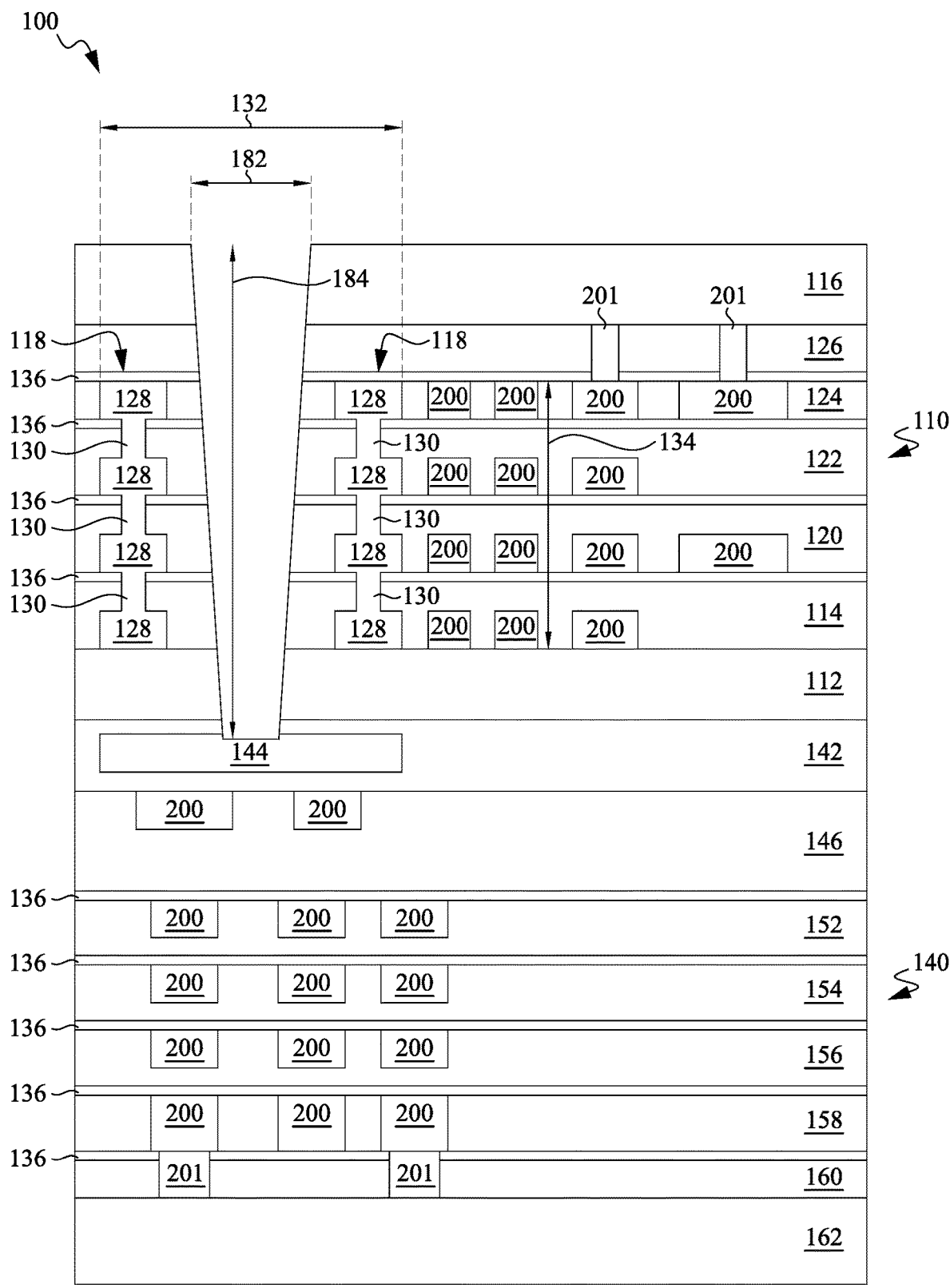

Referring to FIG. 3, an opening 180 is formed in the first portion 110 and the second portion 140. In some embodiments, the opening 180 is formed so that the opening 180 is surrounded by the guard ring 118. In some embodiments, the opening 180 is formed from a top surface of the first substrate 116 and extends through the first substrate 116, the first ILD layer 126, the fourth dielectric layer 124, the third dielectric layer 122, the second dielectric layer 120, the first dielectric layer 114, the first passivation layer 112, and the second passivation layer 142. In some embodiments, the opening 180 exposes the conductive layer 144.

In some embodiments, the opening 180 is formed by at least one of lithography, etching, or other suitable techniques. According to some embodiments, an etchant has a selectivity such that the etchant removes or etches away the first substrate 116, the first ILD layer 126, the fourth dielectric layer 124, the third dielectric layer 122, the second dielectric layer 120, the first dielectric layer 114, the first passivation layer 112, and the second passivation layer 142 at a greater rate than the etchant removes or etches away an overlying patterned photoresist. According to some embodiments, the opening 180 is defined by sidewalls of the first substrate 116, the first ILD layer 126, the fourth dielectric layer 124, the third dielectric layer 122, the second dielectric layer 120, the first dielectric layer 114, the first passivation layer 112, and the second passivation layer 142. In some embodiments, the etchant removes or etches away an amount of at least one of the first substrate 116, the first ILD layer 126, the fourth dielectric layer 124, the third dielectric layer 122, the second dielectric layer 120, the first dielectric layer 114, the first passivation layer 112, or the second passivation layer 142 so as to expose at least some of at least one of a metal layer 128 or a VIA 130 and thus at least some of the opening 180 is defined by at least some of at least one of a metal layer 128 or a VIA 130.

In some embodiments, the opening 180 has a width 182 and a height 184. In some embodiments, the width 182 is about 0.5 micrometers to about 4 micrometers. In some embodiments, the height 184 is about 3 micrometers to about 8 micrometers. According to some embodiments, the opening 180 is defined by tapered sidewalls such that the width 182 varies along the height 184 of the opening 180. In some embodiments, the width 182 decreases moving in a direction from the first substrate 116 to the conductive layer 144. According to some embodiments, the opening has any cross sectional profile, such as stair stepped, hourglass, non-tapered, etc., such as from at least one of using one or more etchants or using one or more etching processes, such as directional etching, isotropic etching, anisotropic etching, etc.

Figure 4:
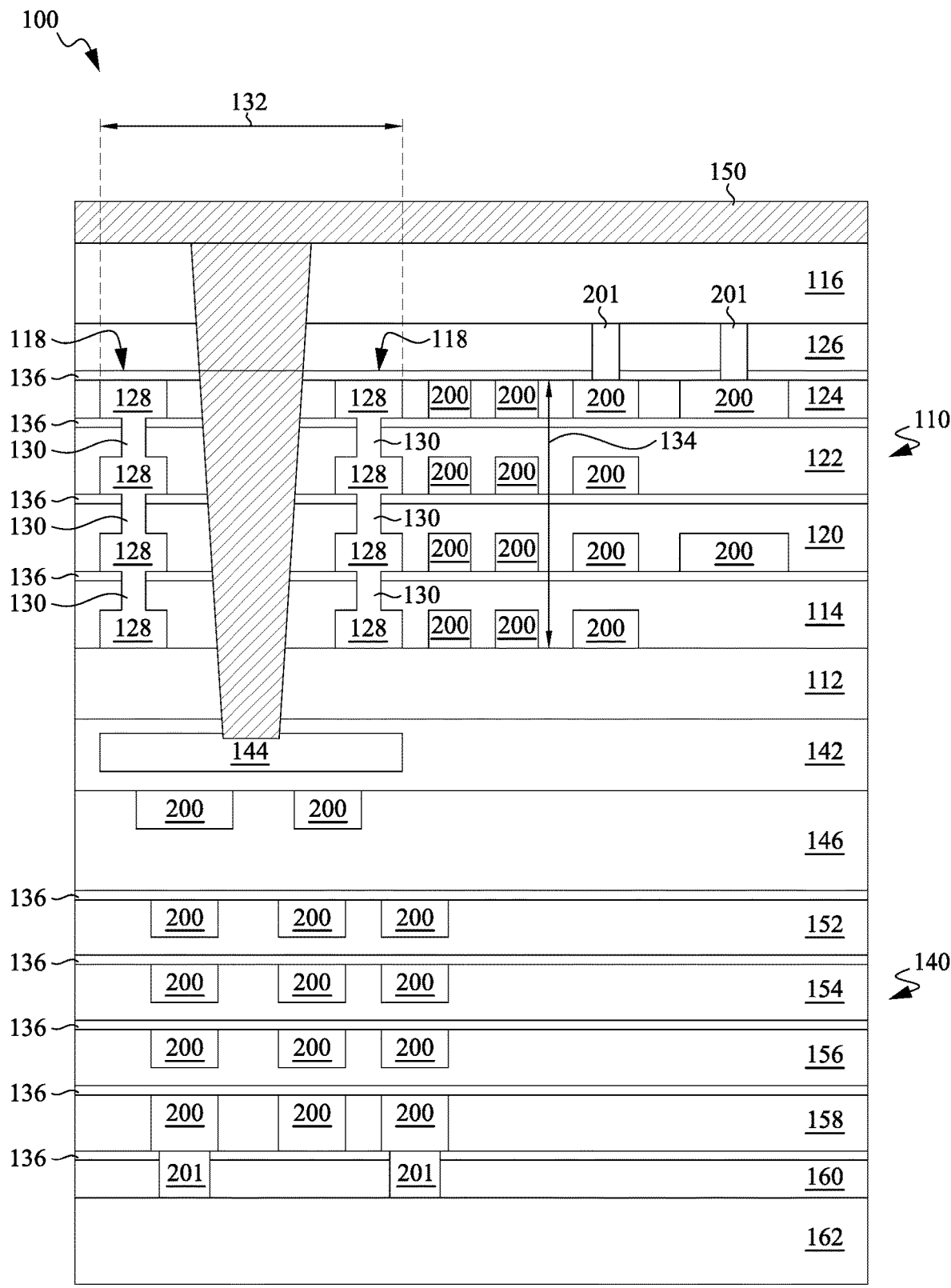

Referring to FIG. 4, a conductive material 150 is formed over the first substrate 116 and in the opening 180. In some embodiments, the conductive material 150 includes at least one of includes Al, Cu, Sn, Ni, Au, Ag, W, or other suitable materials. In some embodiments, the conductive material is formed by at least one of focused-ion beam (FIB), physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

Figure 5:
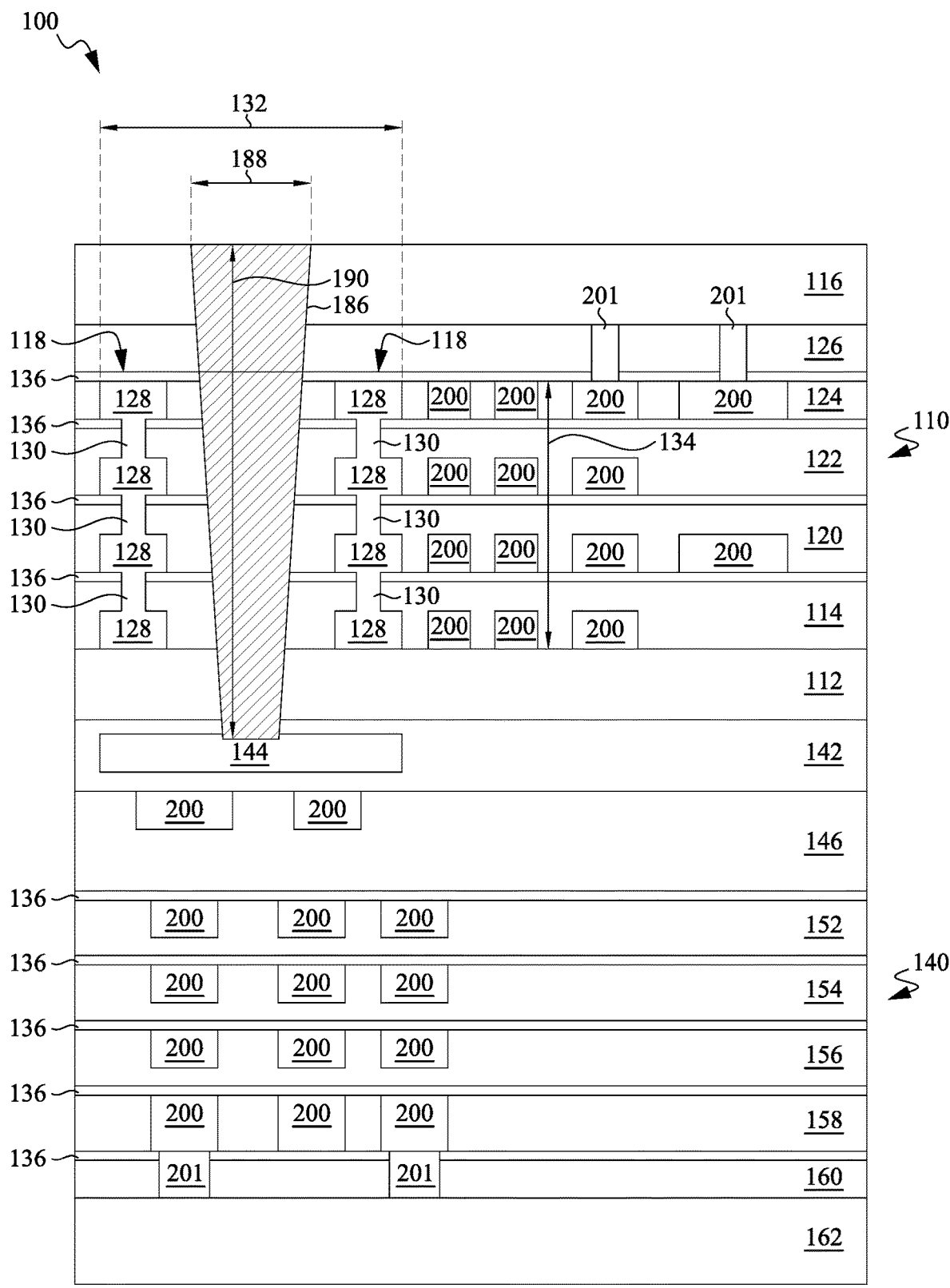

Referring to FIG. 5, excess conductive material is removed to establish a vertical conductive structure 186 in the opening 180. In some embodiments, removal of the excess material conductive exposes the top surface of the first substrate 116. In some embodiments, the vertical conductive structure 186 has a width 188 and a depth 190. According to some embodiments, the width 188 of the vertical conductive structure 186 corresponds to the width 182 of the opening 180. According to some embodiments, the depth 190 of the vertical conductive structure 186 corresponds to the height 184 of the opening 180. According to some embodiments, the vertical conductive structure 186 has any cross sectional profile. According to some embodiments, the vertical conductive structure 186 has a cross sectional profile that corresponds to the cross sectional profile of the opening. According to some embodiments, the width 188 varies along the depth 190 of the vertical conductive structure 186. In some embodiments, the width 188 decreases moving in a direction from the first substrate 116 to the conductive layer 144. According to some embodiments, one or more sidewalls of the vertical conductive structure 186 are at least one of tapered, stair stepped, non-linear, non-tapered, etc. In some embodiments, the excess conductive material is removed by at least one of chemical mechanical polishing (CMP) or other suitable techniques. In some embodiments, an abrasive slurry is used in the removal of the excess material. In some embodiments, the vertical conductive structure 186 comprises a through-silicon VIA (TSV). In some embodiments, a TSV is a high-performance interconnect used as an alternative to wire-bond and flip chips. In some embodiments, the TSV is used in creating 3D packages. In some embodiments, the TSV is used to create 3D integrated circuits (ICs). In some embodiments, the TSV is used to shorten lengths of connections. In some embodiments, the vertical conductive structure 186 comprises a through-organic VIA (TOV).

According to some embodiments, a barrier layer (not shown) is formed over sidewalls, surfaces, etc. defining the opening 180 prior to the conductive material 150. According to some embodiments, the barrier layer is relatively thin and does not fill the opening 180, such that the conductive material 150 is formed over the barrier layer. According to some embodiments, the barrier layer includes at least one of titanium nitride, titanium oxynitride, tantalum nitride, tantalum oxynitride, tungsten nitride, or other suitable materials. In some embodiments, the barrier layer is formed by at least one of focused-ion beam (FIB), physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

Figure 6:
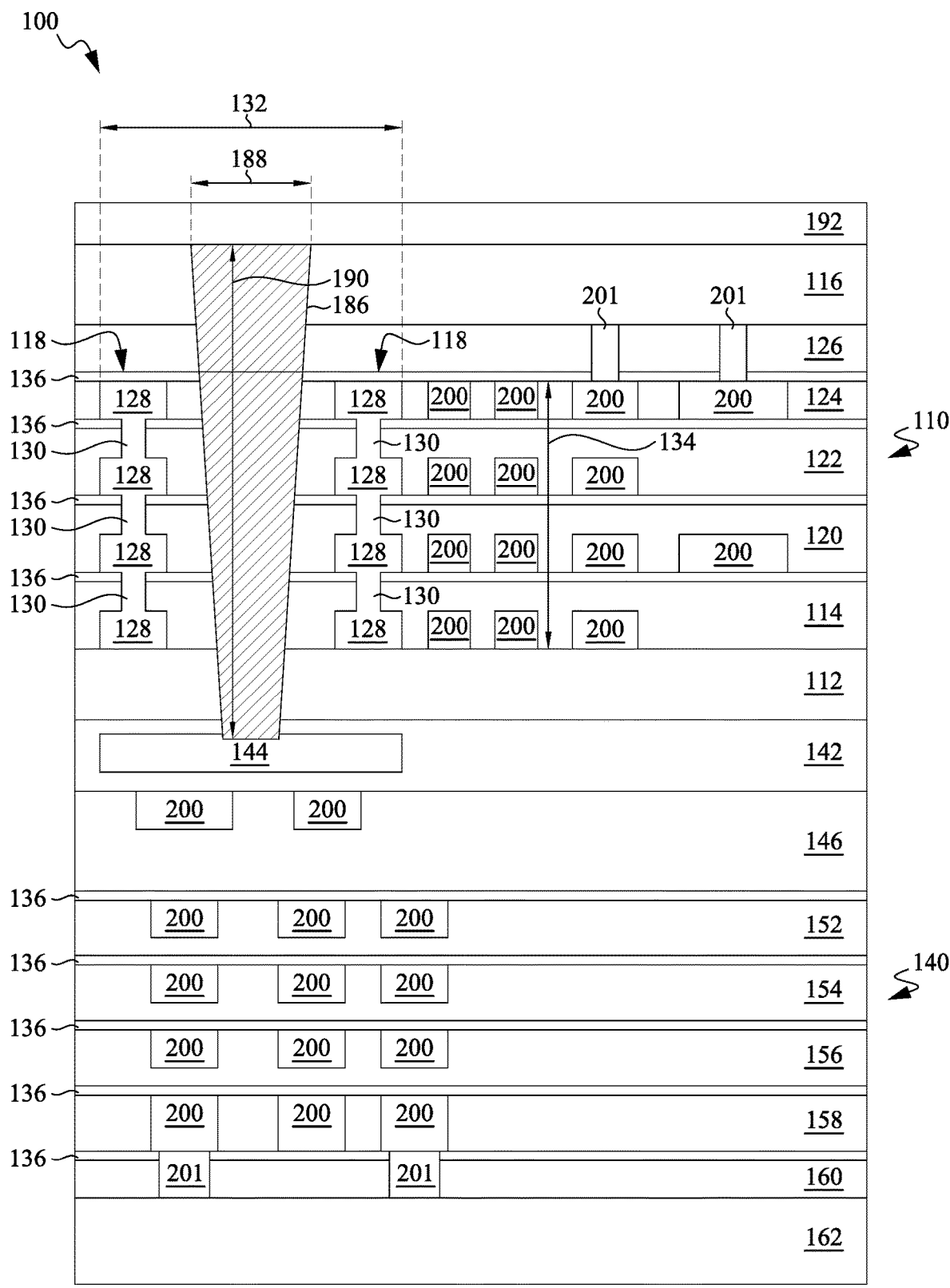

Referring to FIG. 6, a conductive layer 192 is formed over the first substrate 116 and the vertical conductive structure 186. In some embodiments, the conductive layer 192 includes at least one of Al, Cu, Sn, Ni, Au, Ag, W, or other suitable materials. In some embodiments, the conductive layer 192 has a same composition as at least one of the conductive layer 144 or the vertical conductive structure 186. In some embodiments, the conductive layer 192 has a different composition than at least one of the conductive layer 144 or the vertical conductive structure 186. In some embodiments, the conductive layer 144 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

Figure 7:
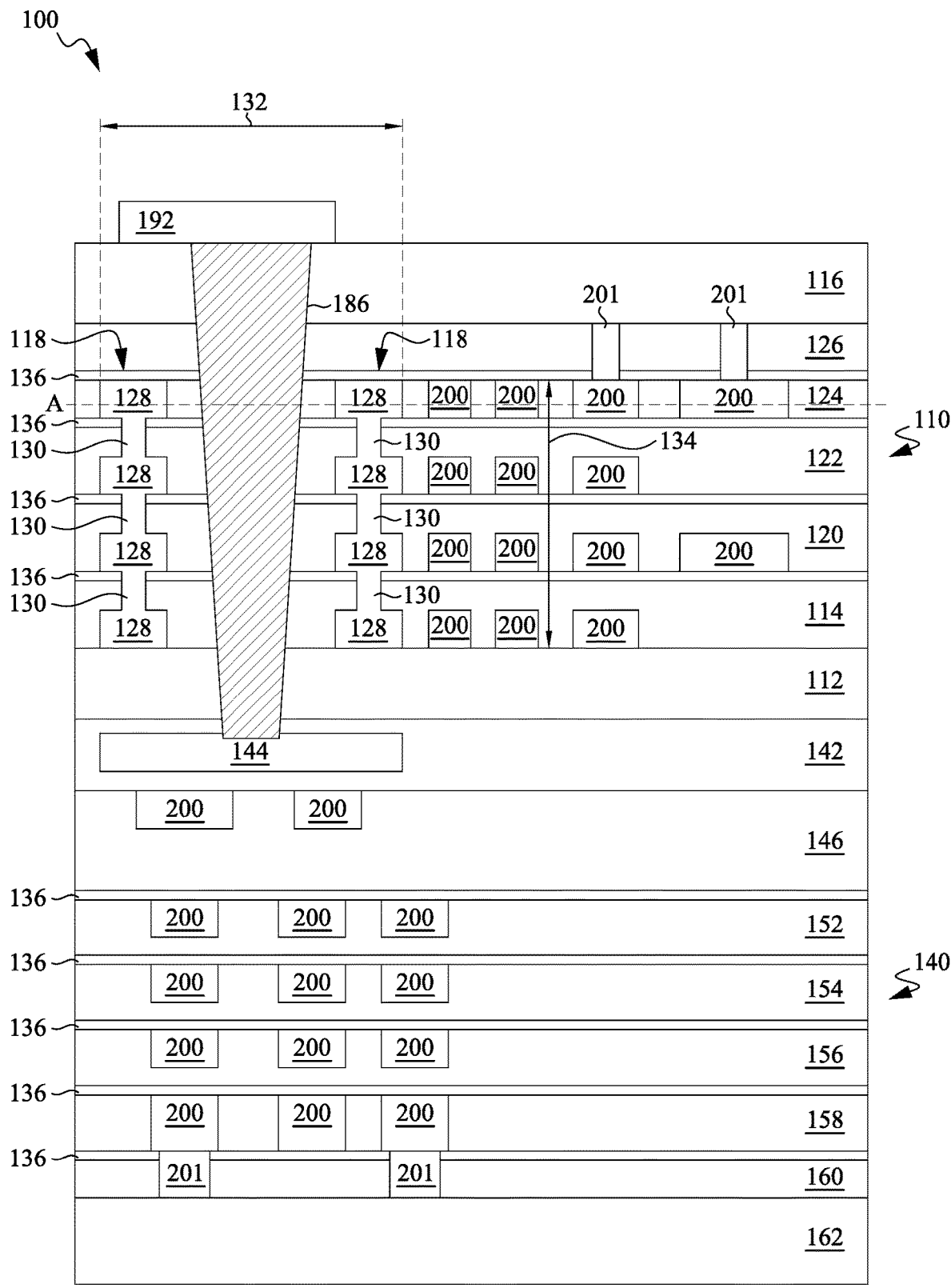

Referring to FIG. 7, the conductive layer 192 is patterned so that portions of the conductive layer 192 are removed from the top surface of the first substrate 116. In some embodiments, the portions of the conductive layer are removed such that the conductive layer 192 covers at least some of the vertical conductive structure 186. In some embodiments, the conductive layer 192 is patterned by at least one of lithography, etching, or other suitable techniques. According to some embodiments, the vertical conductive structure 186 connects the conductive layer 192 in or on the first portion 110 of the semiconductor device 100 to the conductive layer 144 in the second portion 140 of the semiconductor device 100 while being at least partially surrounded, encircled, etc. by the guard ring 118.

Figure 8:
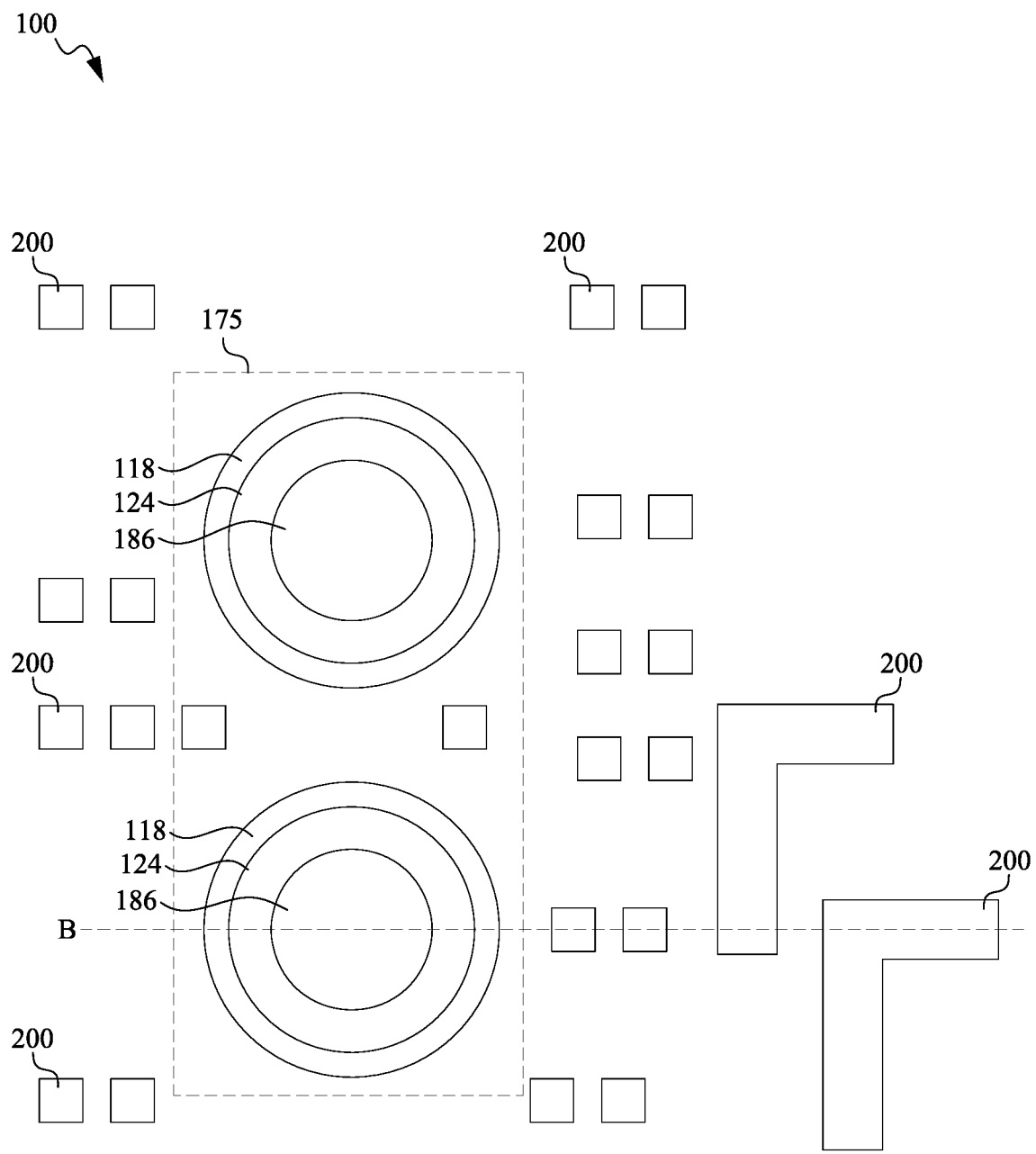
FIG. 8 illustrates a top-down view of a semiconductor arrangement, in accordance with some embodiments.
Figure 10A:
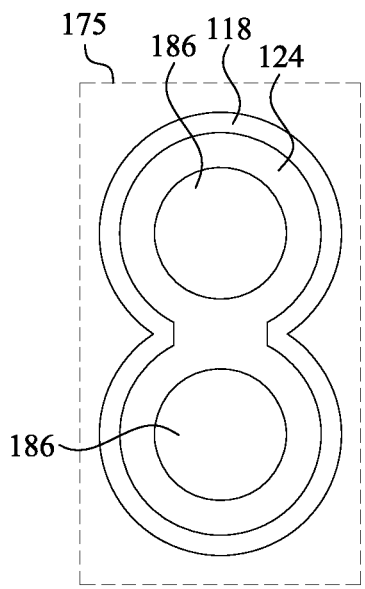
Figure 10B:
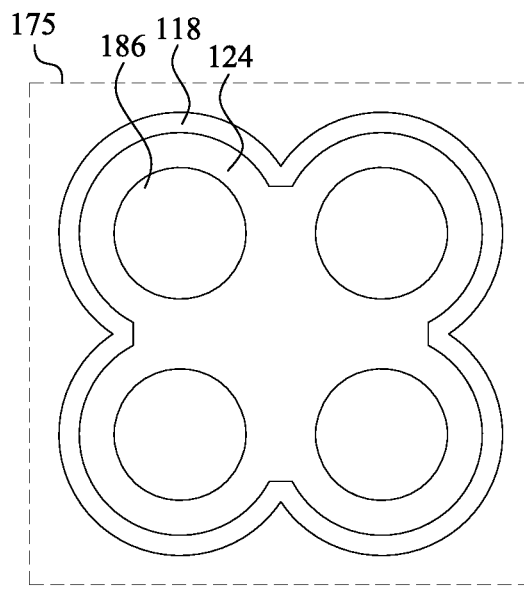
Figure 10C:
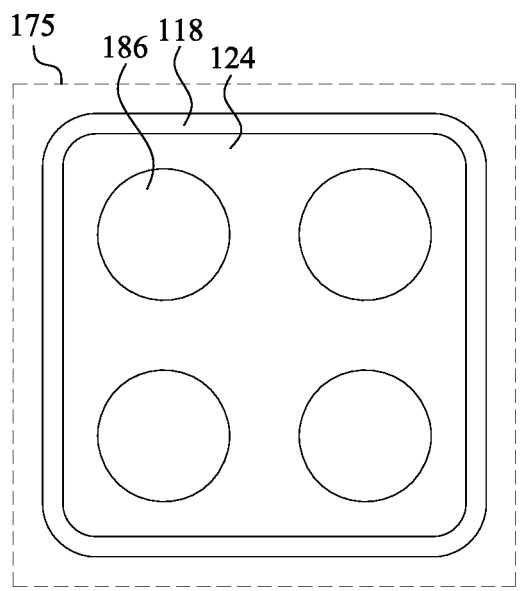
Figure 10D:
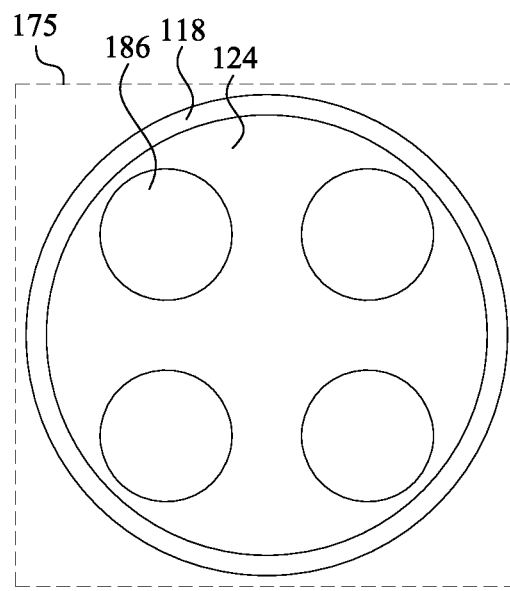

FIG. 8 illustrates a top-down cross-sectional view of the semiconductor arrangement taken along the dashed line A of FIG. 7. According to some embodiments, FIG. 7 corresponds to a cross sectional view taken along the dashed line B in FIG. 8. In some embodiments, FIG. 8 illustrates a top-down cross-sectional view of a semiconductor arrangement formed with a process other than that described with reference to FIGS. 1-7.

In the illustrated embodiment, a vertical conductor area 175 includes first and second vertical conductive structures 186 and first and second guard rings 118. In some embodiments, a plurality of conductive elements 200 exist around the first and second guard rings 118 inside and/or outside of the vertical conductor area 175. In some embodiments, conductive elements 200 are used as wiring for the semiconductor device 100. According to some embodiments, the first and second guard rings 118 completely surround, encircle, etc. all sides or sidewalls of the first and second vertical conductive structures 186, respectively. According to some embodiments, the first and second guard rings 118 may be discontinuous or have a break so as to surround, encircle, etc. some but not all of the first and second vertical conductive structures 186.

FIGS. 9A-9D illustrate top-down views of vertical conductor areas, in accordance with some embodiments. In the illustrated embodiments, each of the vertical conductor areas 175 includes multiple vertical conductive structures 186. In addition, the vertical conductive structures 186 are surrounded by guard rings 118 having various geometries. As illustrated, each vertical conductor area 175 includes multiple vertical conductive structures 186 having a portion of a guard ring 118 therebetween. In addition, each vertical conductive structure 186 is surrounded by a dielectric layer 124, and each dielectric layer 124 is surrounded by a guard ring 118.

FIGS. 10A-10D illustrate top-down views of vertical conductor areas, in accordance with some embodiments. In the illustrated embodiments, each of the vertical conductor areas 175 includes multiple vertical conductive structures 186. In addition, the vertical conductive structures 186 are surrounded by guard rings 118 having various geometries. As illustrated, each vertical conductor area 175 includes multiple vertical conductive structures 186 having a portion of a dielectric layer 124 therebetween, and no guard ring 118 therebetween. In addition, each vertical conductive structure 186 is surrounded by a dielectric layer 124, and each dielectric layer 124 is surrounded by a guard ring 118.

Figure 11A:
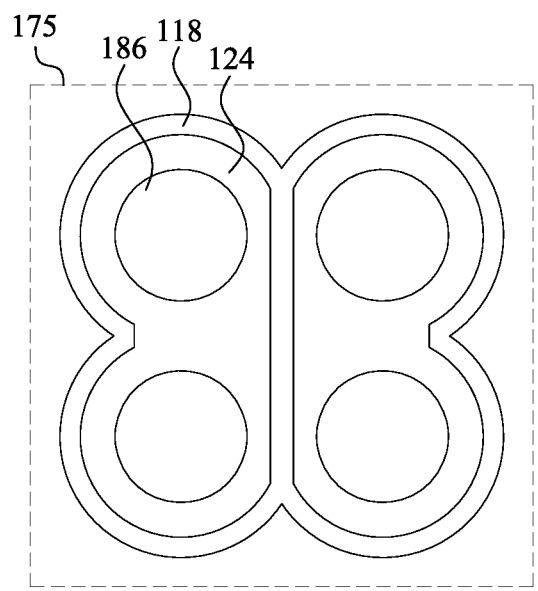
Figure 11B:
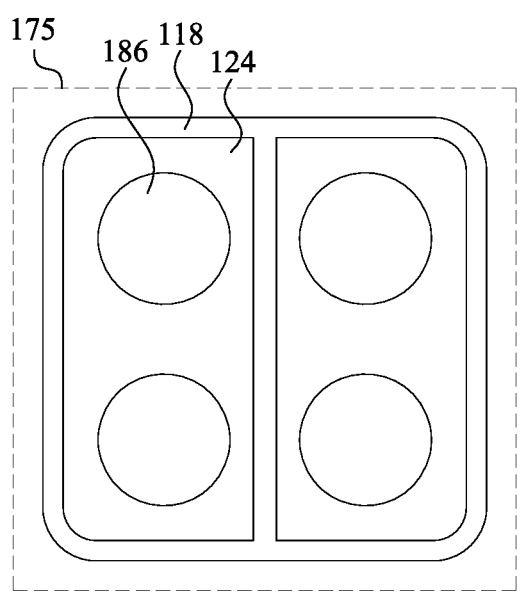

FIGS. 11A-11B illustrate top-down views of vertical conductor areas, in accordance with some embodiments. In the illustrated embodiments, each of the vertical conductor areas 175 includes multiple vertical conductive structures 186. In addition, the vertical conductive structures 186 are surrounded by guard rings 118 having various geometries. As illustrated, each vertical conductor area 175 includes at least one pair of adjacent vertical conductive structures 186 having a portion of a dielectric layer 124 therebetween, and no guard ring 118 therebetween. In addition, each vertical conductor area 175 includes at least one pair of adjacent vertical conductive structures 186 having a portion of a guard ring 118 therebetween. As illustrated, each vertical conductor area 175 includes a first set of vertical conductive structures 186 surrounded by a first guard ring 118, and a second set of vertical conductive structures 186 surrounded by a second guard ring 118, where the first and second guard rings 118 have a shared portion between the first and second sets of vertical conductive structures 186. In addition, each vertical conductive structure 186 is surrounded by a dielectric layer 124, and each dielectric layer 124 is surrounded by a guard ring 118.

Figure 12A:
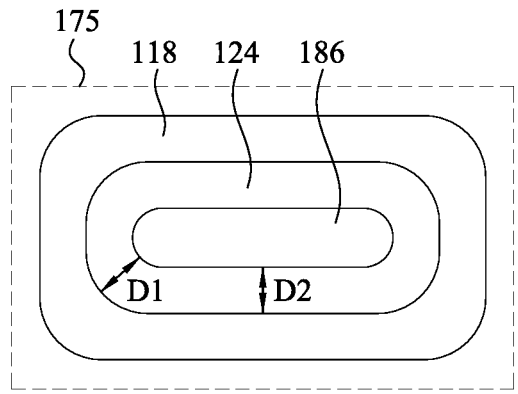
Figure 12B:
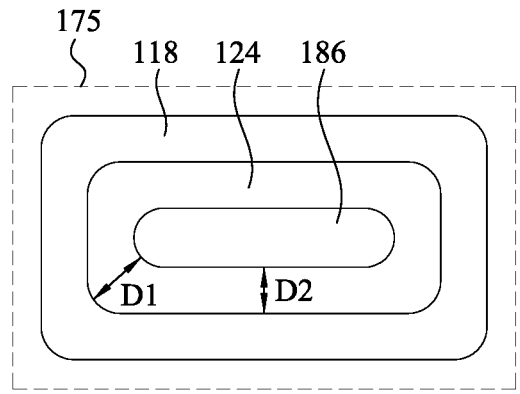

FIGS. 12A-12B illustrate top-down views of vertical conductor areas, in accordance with some embodiments. In the illustrated embodiments, each vertical conductor area 175 includes a vertical conductive structure 186 and a guard ring 118. In addition, the vertical conductive structures 186 and guard rings 118 have various geometries. In the illustrated embodiments, each vertical conductive structure 186 has a maximum length dimension and a maximum width dimension, where the maximum length dimension is greater than the maximum width dimension. For example, the maximum length dimension may be about 1.1 times, about 1.2 times, about 1.3 times, about 1.4 times, about 1.5 times, about 2 times, about 3 times, or another factor greater than the maximum width dimension. The spacing D1 between the vertical conductive structures 186 and the guard rings 118 may be equal to, less than, or greater than the spacing D2 between the vertical conductive structures 186 and the guard rings 118.

Figure 12C:
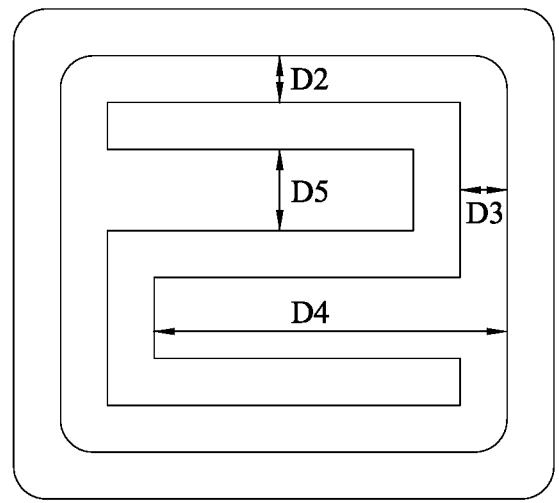

FIG. 12C illustrates top-down views of vertical conductor areas, in accordance with some embodiments. In the illustrated embodiment, vertical conductor area 175 includes a vertical conductive structure 186 and a guard ring 118. In addition, the vertical conductive structure 186 has a serpentine geometry. In the illustrated embodiment, the vertical conductive structure 186 has a maximum length dimension and a maximum width dimension, where the maximum length dimension is greater than the maximum width dimension. For example, the maximum length dimension may be about 5 times, about 6 times, about 10 times, about 15 times, about 20 times, about 25 times, or another factor greater than the maximum width dimension. The spacing D2 between the vertical conductive structure 186 and the guard ring 118 may be equal to, less than, or greater than the spacing D3 between the vertical conductive structure 186 and the guard ring 118. The spacing D4 between the vertical conductive structure 186 and the guard ring 118 may be equal to, less than, or greater than either of the spacings D2 and D3 between the vertical conductive structure 186 and the guard ring 118. The spacing D5 between adjacent segments of the vertical conductive structure 186 may be equal to, less than, or greater than either of the spacings D2 and D3 between the vertical conductive structure 186 and the guard ring 118.

Figure 13A:
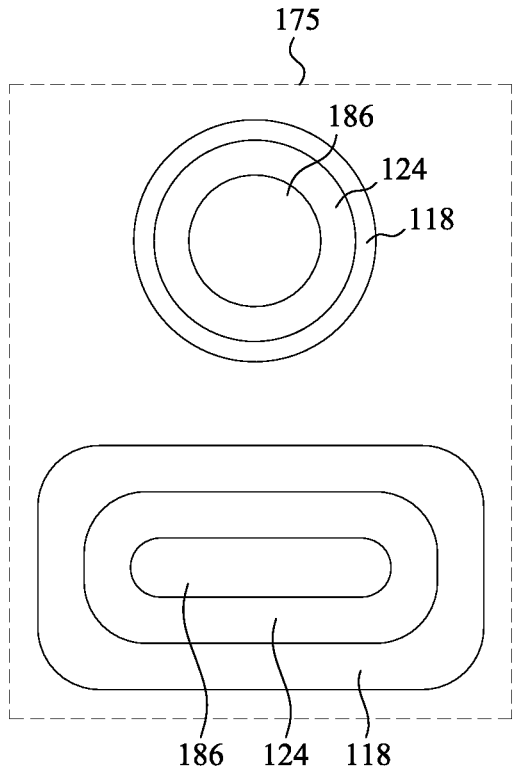

FIG. 13A illustrates a vertical conductor area 175 having first and second vertical conductive structures 186 and first and second guard rings 118. The first and second guard rings 118 completely surround, encircle, etc. all sides or sidewalls of the first and second vertical conductive structures 186, respectively. According to some embodiments, the first and second guard rings 118 may be discontinuous or have a break so as to surround, encircle, etc. some but not all of the first and second vertical conductive structures 186. As illustrated, the first and second vertical conductive structures 186 have different geometries, and the first and second guard rings 118 have different geometries.

Figure 13B:
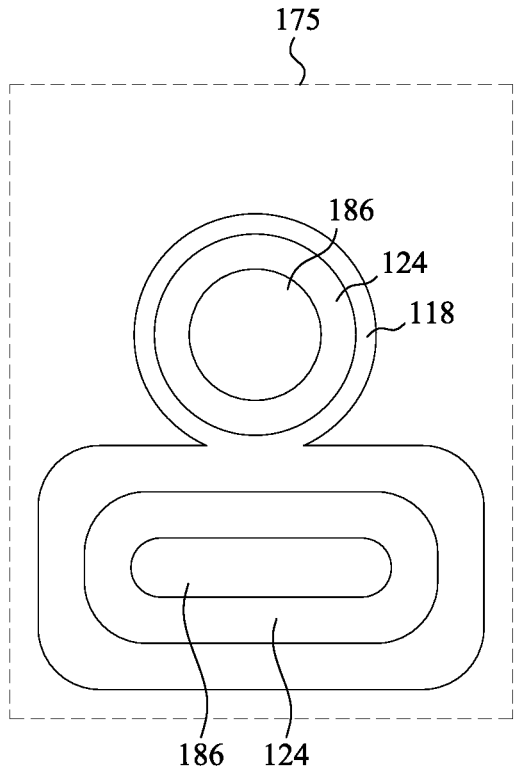
Figure 13C:
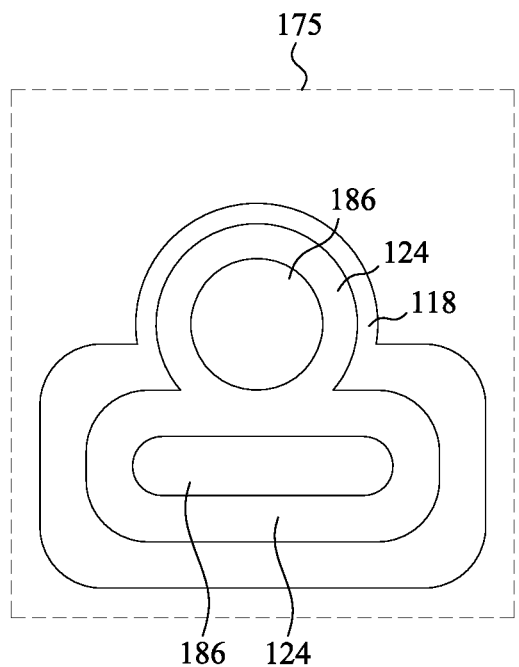

FIGS. 13B-13C illustrate top-down views of vertical conductor areas 175, in accordance with some embodiments. In the illustrated embodiments, each of the vertical conductor areas 175 includes multiple vertical conductive structures 186. In addition, the vertical conductive structures 186 are surrounded by guard rings 118 having various geometries. In addition, each vertical conductive structure 186 is surrounded by a dielectric layer 124, and each dielectric layer 124 is surrounded by a guard ring 118. In the illustrated embodiments, each of the vertical conductor areas 175 includes a circular vertical conductive structure 186 a circular vertical conductive structure 186 having a maximum length dimension and a maximum width dimension, where the maximum length dimension is greater than the maximum width dimension.

In alternative embodiments, a vertical conductor areas 175 includes first and second vertical conductive structures 186, each having a maximum length dimension and a maximum width dimension, where the maximum length dimension is greater than the maximum width dimension. In some embodiments, the maximum length of the first vertical conductive structure 186 is the same or is substantially the same as the maximum length of the second vertical conductive structure 186. In some embodiments, the maximum length of the first vertical conductive structure 186 is the same or is different from the maximum length of the second vertical conductive structure 186. In some embodiments, the maximum width of the first vertical conductive structure 186 is the same or is substantially the same as the maximum width of the second vertical conductive structure 186. In some embodiments, the maximum width of the first vertical conductive structure 186 is the same or is different from the maximum width of the second vertical conductive structure 186.

In alternative embodiments, a vertical conductor areas 175 includes three or more vertical conductive structures 186, each having a maximum length dimension and a maximum width dimension, where the maximum length dimension is greater than the maximum width dimension.

As illustrated in FIG. 13B, the vertical conductor area 175 includes multiple vertical conductive structures 186 having a portion of a guard ring 118 therebetween.

As illustrated in FIG. 13C, the vertical conductor area 175 includes multiple vertical conductive structures 186 having a portion of a dielectric layer 124 therebetween, and no guard ring 118 therebetween.

In the embodiments illustrated in the figures, each vertical conductive structures 186 has a particular geometry. Other geometries and shapes are contemplated. For example, in some embodiments, one or more of the vertical conductive structures 186 may be substantially circular, substantially rectangular, substantially rectangular, substantially elliptical, substantially polygonal, substantially star shaped, substantially pentagonal, substantially hexagonal, etc. In some embodiments, the shape and/or size of each vertical conductive structure 186 in a particular contiguous area is the same or substantially the same as the shape and/or size of the each of the other vertical conductive structures 186 in the particular contiguous area. In some embodiments, the shape and/or size of at least one vertical conductive structure 186 in a particular contiguous area is the different from the shape and/or size of at least one other vertical conductive structures 186 in the particular contiguous area.

In the embodiments illustrated in the figures, each guard ring 118 has a particular geometry. Other geometries and shapes are contemplated. For example, in some embodiments, one or more of the guard ring 118 may be substantially circular, substantially rectangular, substantially rectangular, substantially elliptical, substantially polygonal, substantially star shaped, substantially pentagonal, substantially hexagonal, etc. In some embodiments, the shape and/or size of each guard ring 118 in a particular contiguous area is the same or substantially the same as the shape and/or size of the each of the other guard rings 118 in the particular contiguous area. In some embodiments, the shape and/or size of at least one guard ring 118 in a particular contiguous area is the different from the shape and/or size of at least one other guard rings 118 in the particular contiguous area.

In some embodiments, the shape and/or size of the vertical conductive structure 186 is the same or substantially the same as the shape and/or size of at least one corresponding guard rings 118. In some embodiments, the shape and/or size of the vertical conductive structure 186 is different from the shape and/or size of at least one corresponding guard ring 118.

As discussed in further detail above, the embodiments provide increased area density for vertical conductive structures. Accordingly, design needs for a particular minimum current conducting capacity or for a particular maximum resistance can be met with minimal or reduced area cost for a particular set of manufacturing design rules governing shapes, sizes, and spacings of vertical conductive structures, dielectric layers, and guard rings.

One inventive aspect is a semiconductor device, including a first substrate. The first substrate includes a first dielectric layer, and a vertical conductive area, where the vertical conductive area includes one or more vertical conductive structures extending through the first dielectric layer, where each line segment of a non-square quadrilateral contacts at least one of the one or more vertical conductive structures. The vertical conductive area also includes a continuous conductive guard ring structure in the first dielectric layer, where the continuous conductive guard ring structure surrounds the one or more vertical conductive structures. The semiconductor device also includes a second substrate, including a first conductor, and a second conductor, where the first conductor of the second substrate is electrically connected to at least one of the vertical conductive structures of the first substrate.

In some embodiments, the one or more vertical conductive structures include first and second distinct vertical conductive structures.

In some embodiments, a portion of the continuous conductive guard ring structure is between the first and second distinct vertical conductive structures.

In some embodiments, no portion of the continuous conductive guard ring structure is between the first and second distinct vertical conductive structures.

In some embodiments, the one or more vertical conductive structures includes a first vertical conductive structure having a maximum length dimension greater than a maximum width dimension.

In some embodiments, the one or more vertical conductive structures include a first vertical conductive structure having a serpentine configuration.

In some embodiments, the continuous conductive guard ring structure has a substantially circular portion.

In some embodiments, the continuous conductive guard ring structure has one or more substantially linear portions.

Another inventive aspect is a semiconductor device including a first substrate. The first substrate includes a first dielectric layer, a vertical conductive area, where the vertical conductive area includes a plurality of vertical conductive structures extending through the first dielectric layer. The first substrate also includes a continuous conductive guard ring structure in the first dielectric layer, where the continuous conductive guard ring structure surrounds the vertical conductive structures. The semiconductor device also includes a second substrate, including a first conductor, and a second conductor, where the first conductor of the second substrate is electrically connected to at least one of the vertical conductive structures of the first substrate.

In some embodiments, a portion of the continuous conductive guard ring structure is between a first and a second of the vertical conductive structures.

In some embodiments, no portion of the continuous conductive guard ring structure is between a first and a second of the vertical conductive structures.

In some embodiments, the plurality of vertical conductive structures includes a first vertical conductive structure having a maximum length dimension greater than a maximum width dimension.

In some embodiments, the plurality of vertical conductive structures includes a first vertical conductive structure having a serpentine configuration.

Another inventive aspect is a semiconductor device, including a first substrate. The first substrate includes a first dielectric layer, a vertical conductive area, where the vertical conductive area includes a plurality of vertical conductive structures extending through the first dielectric layer, and a continuous conductive guard ring structure in the first dielectric layer, where the continuous conductive guard ring structure defines one or more enclosed areas, and where one or more of the vertical conductive structures are in each enclosed area. The semiconductor device also includes a second substrate, including a first conductor, and a second conductor, where the first conductor of the second substrate is electrically connected to at least one of the vertical conductive structures of the first substrate.

In some embodiments, a portion of the continuous conductive guard ring structure is between a first and a second of the vertical conductive structures.

In some embodiments, no portion of the continuous conductive guard ring structure is between a first and a second of the vertical conductive structures.

In some embodiments, the plurality of vertical conductive structures includes a first vertical conductive structure having a maximum length dimension greater than a maximum width dimension.

In some embodiments, the plurality of vertical conductive structures includes a first vertical conductive structure having a serpentine configuration.

In some embodiments, the continuous conductive guard ring structure has a substantially circular portion.

In some embodiments, the continuous conductive guard ring structure has one or more substantially linear portions.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first substrate, comprising:
a first dielectric layer,
a vertical conductive area, wherein the vertical conductive area comprises:
a plurality of vertical conductive structures extending through the first dielectric layer, the plurality of vertical conductive structures comprising a first vertical conductive structure and a second vertical conductive structure, and
a continuous conductive guard ring structure in the first dielectric layer, wherein the continuous conductive guard ring structure comprises a first guard ring portion laterally enclosing the first vertical conductive structure and a second guard ring portion laterally enclosing the second vertical conductive structure, and the first guard ring portion and the second guard ring portion share an overlapping portion; and
a second substrate, comprising:
a first conductor, and
a second conductor,
wherein the first conductor of the second substrate is electrically connected to at least one of the vertical conductive structures of the first substrate.

2. The semiconductor device of claim 1, wherein the first guard ring portion is circular, and the second guard ring portion is circular.

3. The semiconductor device of claim 1, wherein the first guard ring portion is rectangular, and the second guard ring portion is rectangular.

4. The semiconductor device of claim 1, wherein the first vertical conductive structure is characterized by a maximum length dimension greater than a maximum width dimension.

5. The semiconductor device of claim 1, wherein the first vertical conductive structure is characterized by a serpentine configuration.

6. The semiconductor device of claim 1, wherein the continuous conductive guard ring structure has a substantially circular portion.

7. The semiconductor device of claim 1, wherein the continuous conductive guard ring structure has one or more substantially linear portions.

8. A semiconductor device, comprising:
a first substrate, comprising:
a first dielectric layer;
a plurality of vertical conductive structures extending through the first dielectric layer, the plurality of vertical conductive structures comprising a first vertical conductive structure and a second vertical conductive structure; and
a continuous conductive guard ring structure disposed in the first dielectric layer, wherein the continuous conductive guard ring structure comprises a first guard ring portion laterally enclosing the first vertical conductive structure and a second guard ring portion laterally enclosing the second vertical conductive structure, and the first guard ring portion and the second guard ring portion share an overlapping portion; and
a second substrate, comprising:
a first conductor; and
a second conductor; and
wherein the first conductor of the second substrate is electrically connected to at least one of the vertical conductive structures of the first substrate.

9. The semiconductor device of claim 8, wherein the first guard ring portion is circular, and the second guard ring portion is circular.

10. The semiconductor device of claim 8, wherein the first guard ring portion is rectangular, and the second guard ring portion is rectangular.

11. The semiconductor device of claim 8, wherein the first vertical conductive structure is characterized by a maximum length dimension greater than a maximum width dimension.

12. The semiconductor device of claim 8, wherein the first vertical conductive structure is characterized by a serpentine configuration.

13. The semiconductor device of claim 8, wherein the continuous conductive guard ring structure has a substantially circular portion.

14. The semiconductor device of claim 8, wherein the continuous conductive guard ring structure has one or more substantially linear portions.

15. A semiconductor structure, comprising:
- a first substrate, comprising:
  - a first dielectric layer;
  - a plurality of vertical conductive structures extending through the first dielectric layer, the plurality of vertical conductive structures comprising a first vertical conductive structure and a second vertical conductive structure; and
  - a continuous conductive guard ring structure disposed in the first dielectric layer, wherein the continuous conductive guard ring structure comprises a first guard ring portion laterally enclosing the first vertical conductive structure and a second guard ring portion laterally enclosing the second vertical conductive structure, and the first guard ring portion and the second guard ring portion share an overlapping portion; and
- a second substrate comprising a first conductor; and
- wherein the first conductor of the second substrate is electrically connected to at least one of the vertical conductive structures of the first substrate.

16. The semiconductor structure of claim 15, wherein the first guard ring portion is circular, and the second guard ring portion is circular.

17. The semiconductor structure of claim 15, wherein the first guard ring portion is rectangular, and the second guard ring portion is rectangular.

18. The semiconductor structure of claim 15, wherein the first vertical conductive structure is characterized by a maximum length dimension greater than a maximum width dimension.

19. The semiconductor structure of claim 15, wherein the first vertical conductive structure is characterized by a serpentine configuration.

20. The semiconductor structure of claim 15, wherein the continuous conductive guard ring structure has a substantially circular portion.

\* \* \* \* \*